United States Patent [19]

Hunt

[11] 4,188,598
[45] Feb. 12, 1980

[54] ELECTRICAL FILTER

[76] Inventor: Morris C. Hunt, 41926 Camino Santa Barbara, Fremont, Calif. 94538

[21] Appl. No.: 849,181

[22] Filed: Nov. 7, 1977

[51] Int. Cl.² .................... H03H 7/10; H01P 1/20; H01P 7/04
[52] U.S. Cl. ........................... 333/207; 333/12; 333/176; 333/181
[58] Field of Search ............ 333/76, 79, 70 R, 73 C, 333/70 S, 12, 73 R, 1–6, 97 R, 167, 174–181, 202, 206, 207; 328/262, 263, 264, 265, 26

[56] References Cited

U.S. PATENT DOCUMENTS

| 2,270,416 | 1/1942 | Cork et al. | 333/73 C |
| 2,923,868 | 2/1960 | Giacoletto | 357/13 |

OTHER PUBLICATIONS

Salzberg–"On the Optimum Length for Transmission Lines Used as Circuit Elements Publication No. St-93 Research and Engineering Dept. RCA, Harrison, N.J., Dec. 1937; Title Page and pp. 1561–1564.

Primary Examiner—Alfred E. Smith
Assistant Examiner—Marvin Nussbaum
Attorney, Agent, or Firm—Grover A. Frater

[57] ABSTRACT

A four-terminal radio frequency interference filter is described which combines a series connected parallel tuned circuit with a pair of capacitors to form a pi network. In one refinement, a quarter wave coaxial stub and a zener diode are connected in parallel with one another and with one leg of the pi network. The series combination of a diode and a resistor are connected in parallel with the other leg. Filtering is improved by inductive coupling between the diode-resistor circuit and the coil of the tuned circuit.

14 Claims, 3 Drawing Figures

ELECTRICAL FILTER

This invention relates to improvements in electrical filters, and it relates particularly to filters intended for inclusion in the power supply line of electronic apparatus from which it is desired to exclude radio frequency energy.

BACKGROUND OF THE INVENTION

Unless protected, electronic signal processing apparatus, whether it be analog or digital in form, is sensitive to changes in supply voltage amplitude. Line voltage changes are often called "noise," especially when those changes occur at random. It is an integral part of many electrical design tasks either to eliminate noise from the power lines or to devise a system which is immune from the effects of such noise.

The problem occurs in many electronic applications. It is a particularly difficult problem in the design of radio receivers for mobile operation in motor vehicles. Generators and alternators, electric fuel pumps and windshield wipers, ignition systems, turning lights and automatic speed control servo systems, electric gauges and indicators, and voltage controllers all combine to impose transients and noise signals upon the basic unidirectional battery power source. That noise often appears as static in mobile radio receivers. The designers of entertainment radios ordinarily include noise limiting circuitry the effect of which is to permit the detection only of those radio signals whose amplitude is well above the noise level. The penality for that approach is that weaker radio signals go undetected along with elimination of the noise. That alternative is usually not available to designers of communication radio receivers and the receiving section of radio transceivers. Weak signal reception must be preserved in such radios, and the task has been to attempt to eliminate incoming noise, sometimes both at the antenna and at the input power line, but more often only at the power line.

The traditional approach has been to use brute force filtering. That involves including an inductive reactor in the ungrounded power supply line and by-pass capacitors between the ungrounded supply line and the vehicle ground. Such filtering may be coupled with the use of radio frequency noise suppression in the vehicle ignition system. Such suppression serves to diminish the radiation of radio frequency energy that might be picked up by the receiving antenna or that might be induced in the power leads.

Brute force filtering and ignition system shielding can, and usually do, have a substantial effect in diminishing noise and the effect is to permit reception of some of the weaker signals. However, the problem of noise entering mobile radios through power lines is still a very serious one in communication systems that are operated at high frequency or low power, or both. As a consequence, much room for improvement has remained in public safety, radio amateur, and citizens band mobile communications.

SUMMARY OF THE INVENTION

It is an object of this invention to provide a method and a means by which a substantial amount of noise may be removed from motor vehicle power lines whereby improved, weak signal radio reception can be achieved. It is another object to provide such a noise reduction at minimum cost, and in a manner that is applicable both to new radio installations and to old. That is, it is an object to provide a noise elimination method and means that can be incorporated in new radio receivers and that can be added to motor vehicles without need to modify the receiver.

In the case of a transceiver, the same power supply lines that furnish power to the receiver also furnish power to the transmitter. Because of that, any filtering in the power supply lines must be arranged so that it can withstand the heavier current flow required for transmission, as well as current flow in the receiving mode. In the brute force approach, that requirement results in an increase in the size and the weight and the cost of the inductor. In some degree it requires the use of larger and more costly capacitors. Another object of the invention is to provide noise reduction in transceiver and other high current applications without the payment of any significant weight or cost penalty. In this connection, it is an object of the invention to provide a noise reduction apparatus that can be packaged in very small volume whereby to facilitate installation in motor vehicles at a point immediately adjacent to the radio apparatus.

These and other objects and advantages which will hereinafter appear are realized by accomplishing in-line filtering in the power supply leads. A coaxial cable is employed in conducting current from the power source to the radio. Beyond that, the method of the invention permits use of apparatus that occupies a sufficiently small volume so that it can be conveniently contained within the radio housing or packaged in a unit external to the radio housing. Rather than attempt brute power filtering, the invention operates to exclude radio frequency energy at or near the received frequency from entering into the receiver circuitry through the power lines. Any component of power line noise that has a frequency at or near the received frequency results in voltage and signal changes in the RF amplifier, local oscillator, and mixer circuitry which is capable of hetrodyning with the local oscillator signal. The effect of such hetrodyning is to produce random signal pulses that have frequency components in the pass band of the intermediate frequency amplifier of the radio. In the invention, signals that can mix with the local oscillator, or with the received signal, such as to produce the sum or difference signal of intermediate frequency, are precluded from entering into the front end circuitry of the receiver via the power lines. It is conventional to attempt to do that in the antenna input circuitry. In the invention, it is accomplished in the ungrounded power line by the inclusion of a trap tuned to a frequency equal to or near the received frequency. While the trap may have other configurations, the parallel tuned combination of a capacitor and coil is preferred. A coaxial cable is connected so that its outer braid at one end is grounded and so that the center conductor of the cable is connected to the ungrounded or "hot" line at a point on the supply side of the trap. The center conductor is connected at the other end of the cable to the battery of the vehicle. The shield braid is not grounded at that other end.

In the preferred form of the invention, the coaxial cable approaches, but is somewhat less than, a quarter wave length long at the received frequency. It is operated as a one-fourth wave line but is made shorter to permit tuning within the tuning frequency range of the receiver. Tuning is made possible by connecting a variable capacitor across the power lines at a point on the receiver side of the tuned trap. That capacitor is advantageously supplemented by capacitor connected between the center conductor and the shield at the source end of the coaxial cable. In that arrangement, the cable is made to operate as a high Q trap at the received frequency without restricting RF signal rejection to a narrow pass band. That result is obtained from the combination of the tuned trap and the quarter wave stub.

Another result, also unexpected, arises out of use of the quarter wave stub as the unidirectional power conductor. The outer conductor of the coaxial cable is grounded only at the trap end. Nonetheless, it serves as a shield against inductive pick-up of radio frequency energy. The distributed capacitance and inductance of the coaxial cable perform some of the function that is ordinarily performed by a brute force filter. Flow of radio frequency currents of all frequency along the center conductor is impeded, and some of the radio frequency energy is shunted to ground through the distributed capacitance of the coaxial cable.

In the preferred system, the apparatus already described is supplemented by inclusion of a zener diode across the power lines at the supply side of the tuned trap. That diode could be connected at either end of the coaxial cable, but packaging is simplified by connecting it immediately adjacent to the trap.

A second diode, a light emitting diode, is connected across the power lines in series with a current limiting resistor. It serves as an indicator that the user has installed the noise filter properly, and particularly that he has made an adequate ground connection. In addition, it serves as a rectifier and shunts current from the positive supply line to ground on negative voltage peaks.

The filter thus far described works well, but its performance is enhanced by inductively coupling a resistive circuit to the trap coil. That has no effect on the unidirectional component of current flow through the coil, but it does provide a way to dissipate the energy in radio frequency currents circulating in the trap without having a significant effect upon the Q of the trap. In the preferred form of the invention, that circuit arrangement is provided by winding the coil of the trap around the limiting resistor for the light emitting diode. The arrangement has a measurably better effect when the limiting resistor is connected at the output end of the trap.

DRAWINGS

Figure 1:
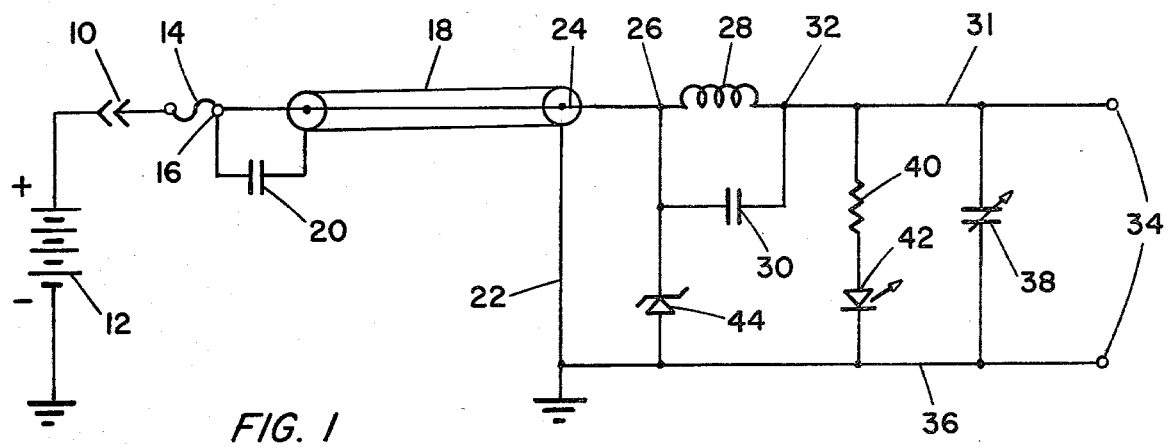
FIG. 1 is a schematic diagram of an electrical filter which embodies the invention.

The preferred form of the invention is illustrated schematically in FIG. 1. It is described by the circuit to the right of the power connection 10. The battery 12 at the left of the connection represents the source of electrical power in a motor vehicle. In practice, that source ordinarily comprises the combination of a battery and an alternator, or a battery and a generator. The battery and alternator or generator is connected in circuit with a variety of apparatus including ignition systems and electric motors and other apparatus that have the effect of making electrical transients and other noise signals appear at the power connection 10. Thus it is that the battery 12 is representative of a power source that includes not only unidirectional, but also alternating and transient components.

The invention is applicable to negative ground as well as to positive ground systems. However, the diodes of the filter circuit are shown polarized on the assumption that the positive side of the unidirectional source 12 will appear at the connection 10. Changes in the polarity of the zerer diodes and the light emitting diodes must be made if it is to be operated with positive ground.

The filtering circuit is traced from the positive connection 10 through a protective fuse 14 to a junction 16. The center conductor of a length 18 of coaxial cable is connected to junction point 16. A capacitor 20 is interconnected between the center conductor and the braid of the coaxial cable at the power connection end. At the other end of the cable, its braid is connected to ground by line 22. The center conductor 24 is connected to a junction 26 at one end of the parallel combination of an inductor 28 and a capacitor 30. At the opposite end of the circuit, the coil and capacitor are connected to one another and to the "hot" output conductor line 31 at a junction 32. Conductor line 31 is connected to the positive terminal of a pair of output terminals 34 the other of which is connected to ground by a line 36. A variable capacitor 38 is connected between lines 31 and 36 in parallel with the series combination of a resistor 40 and a diode 42. The diode 42 emits light when the diode is turned on. The circuit is completed by a zener diode 44 which is connected between junction 26 and line 36 and a capacitor 45 connected in parallel with diode 42. Diode 42 is polarized so that it conducts current from line 32 to the ground line 36. The zener diode 44 is connected so that it conducts, if at all, from the ground line 36 to the junction 26.

Coil 28 and capacitor 30 are selected so that they exhibit parallel resonance at the noise frequency that would be most troublesome if permitted to appear at the output terminals 34. In the case of a citizen's band transceiver used in mobile operation, a major source of noise appearing in the audio output circuits of the receiver section may arise because 27 mHz noise signals find their way into the radio frequency amplification sections and the first mixer of the receiver. In the event that the unit was to be connected to the power connections of a citizen's band transceiver, the coil 28 and capacitor circuit would be tuned to 27 mHz. It will be apparent that capacitor 38, in series with capacitor 20, is in parallel with capacitor 30. It functions as a trimmer capacitor to permit fine adjustment of the circuit resonant frequency.

The use of a tuned trap in the ungrounded supply line is conventional. However, tuning that trap with a trimmer capacitor connected from one end of the trap to ground, as trimmer 38 is connected, is unusual and a feature of the invention.

The diode 44 is connected so that it will conduct and dissipate negative spikes of whatever frequency may appear at junction 26 in the ungrounded supply line. That function itself is conventional, but in this case, the diode is connected between the center conductor and the shield of that end of the coaxial cable which is connected between the tuned circuit and ground. The coaxial cable 18 is approximately one quarter wave length long at the resonant frequency of the coil 28 and capacitor 30 combination. In the preferred embodiment, the electrical length of the cable is made substantially one quarter length long by the addition of capacitor 20. The capacitor is connected between the center conductor and the braid at the ungrounded end of the coaxial cable.

The combination of resistor 40 and diode 42 provides several functions. They are selected so that a small amount of current flows from the positive to the negative line. Enough current is permitted to flow so that the diode is turned on. Thus, the diode serves as an indicator that the filter is properly connected and that the ground connection is addquate. In performing that function, resistor 40 is a current limiter. In some degree, that same circuit tends to serve as a voltage limiter. However, in the preferred form of the invention, it serves another function. Coil 28 is wound around the resistor 40 so that the current path represented by the resistor is inductively coupled to the coil. In one form, the body of the resistor serves as the form on which the coil is wound. The effect of the coupling is a transformer action. That action is described by Lens' law. Only the alternating component of the energy flowing in the coil is induced in the resistor. There it is dissipated in part as heat. The effect of that is to reduce the Q of the tuned circuit. However, the resistor is connected in series with the rectifying diode 42 so that energy dissipation occurs only on alternate half cycles.

Figure 2:
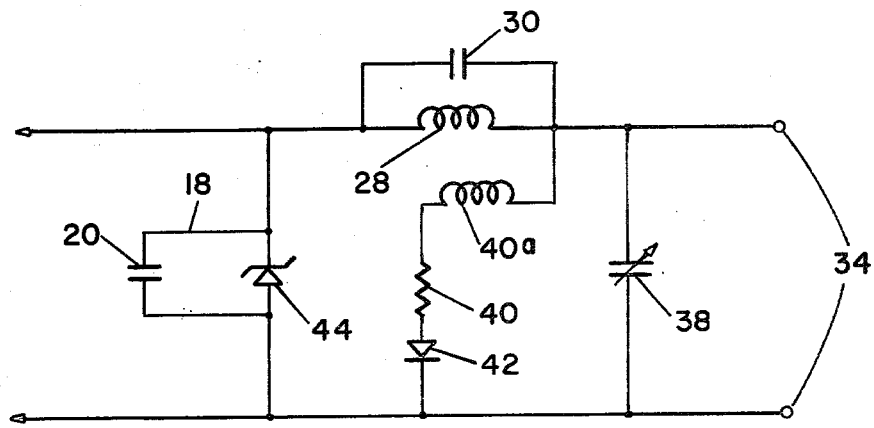
FIG. 2 is an approximate equivalent circuit of the filter illustrated in FIG. 1.

That arrangement of coil and resistor provides a measurable advantage in filtering action over the arrangement in which the resistor is not positioned within the coil. Nonetheless, the use of the resistor and the diode 42 aid filtering action independently of any inductive coupling. A similar phenomenon is observed in the combination of the coaxial cable and the diode 44. Each contributes to filtering action independently of the other, but their use in combination results in a measurable improvement over their respective contributions. The combination of all of the features results in a circuit that is quite complex. To facilitate its understandability, at least in a qualitative sense, an approximate electrical equivalent has been diagrammed in FIG. 2. The several elements in FIG. 2 are identified with the same reference numerals that they have in FIG. 1. However, a winding 40a has been added to the circuit in FIG. 2 to indicate that there is an inductive coupling from the resistor 40 to the coil 28 of the parallel resonant circuit. In the case of a filter made for use with apparatus operating at 27 mHz, the coil 28 may comprise eight turns wound on one-quarter inch diameter to a length of 9/16ths inches. Capacitor 30 has a value of 168 picofarad. The capacitor 38 has a value of 100 pF when the coaxial cable comprises a length 96 inches long of RG8u cable exhibiting about 236 pF of capacitance. For best results, the lead from the center conductor of the coaxial cable to the positive terminal of the battery should be no longer than about 12 inches. A representative value of resistor 40 is 330 ohms. The light emitting diode 42 is selected to draw about 40 mA with a five to seven volt drop. Zener diode 44 is a fifteen- to eighteen-volt, one-watt device such as Motorola type Z0419. At 27 mHz, the capacitor 38 should be a ceramic unit variable from nine to forty-five picofarads, and capacitor 20 should have a value of 100 picofarads.

Figure 3:
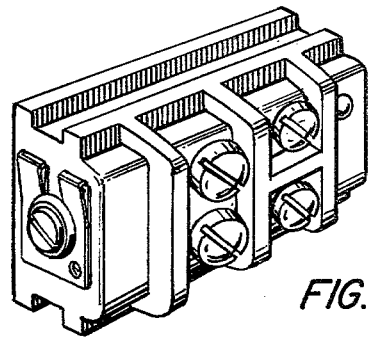
FIG. 3 is a schematic view of a housing in which portions of the filter are contained.

A suitable form of capacitor is shown at the left end of the housing depicted in FIG. 3 of the drawing. That housing is about one and one-fourth inches wide and two and one-half inches long, and it stands about one inch high. One of the advantages of the invention is that all but the coaxial cable and the capacitor 20 of the filter unit can be packaged in a unit of that size with large terminals of the kind used in a conventional terminal tie board to make installation and the installation instructions easier to accomplish and to understand.

The coaxial cable serves as the ungrounded supply lead, and its function is undisturbed by being arranged so that it meanders from the radio position through the fire wall and into the engine compartment.

Although I have shown and described certain specific embodiments of my invention, I am fully aware that many modifications thereof are possible. My invention, therefore, is not to be restricted except insofar as is necessitated by the prior art.

I claim:

1. In a band rejection filter for use in the power leads to a radio apparatus, in combination:
    a pair of input terminals and a pair of output terminals;
    the parallel combination of a coil and a capacitor;
    a length of coaxial cable having its center conductor connected, at one end of said cable, to a respectively associated end of said coil;
    the outer conductor of said cable, at said one end of said cable, being connected to one input terminal and to one output terminal;
    the other input terminal being connected to the inner conductor of the cable at the other end of the cable;
    the other end of said coil being connected to the other output terminal; and
    a series circuit including a current limiting resistor connected across said output terminals and magnetically coupled to said coil.

2. The invention defined in claim 1 in which said coaxial cable approaches one-fourth wave length long at the frequency to which said parallel combination of a coil and capacitor are resonant.

3. The invention defined in claim 1 which further comprises a zener diode connected across said center conductor and said outer conductor at said one end of said coaxial cable.

4. The invention defined in claim 2 in which said coaxial cable is shorter than one-fourth wave length long and which further comprises a loading capacitor connected between the inner and outer conductors of said coaxial cable at said other end thereof.

5. In a band rejection filter for use in the power leads to a radio, in combination:
    a pair of input terminals and a pair of output terminals;
    the parallel combination of a coil and a capacitor;
    a length of coaxial cable having its center conductor connected, at one end of said cable, to a respectively associated end of said coil;
    the outer conductor of said cable, at said one end of said cable, being connected to one input terminal and to one output terminal;
    the other input terminal being connected to the inner conductor of the cable at the other end of the cable;
    the other end of said coil being connected to the other output terminal;
    said coaxial cable approaching, but being shorter than, one-fourth wave length long at the frequency to which said parallel combination of a coil and capacitor are resonant;
    a loading capacitor connected between the inner-outer conductors of said coaxial cable at said other end thereof; and
    a third capacitor connected across said output terminals, one of said capacitors being variable.

6. The invention defined in claim 5 which further comprises the series circuit combination of a second diode connected in the forward biased direction in series with a limiting resistor across said output terminals in parallel with said third capacitor.

7. The invention defined in claim 6 in which said series circuit is magnetically coupled to said coil.

8. The invention defined in claim 7 in which said coil is wound around said limiting resistor such that they share a common axis, that lead of the resistor adjacent to the one end of the coil which is connected to an output terminal being connected to said one end of the coil whereby direct current flow in the coil and the resistor proceeds in opposite directions.

9. The invention defined in claim 6 in which said second diode is a light emitting diode.

10. The method of inhibiting radio frequency energy of a given frequency from entering into an electronic apparatus through the pair of electrical power lines by which that apparatus is powered, which method comprises the steps of:
   connecting the parallel combination of a coil and capacitor in series with one of said power lines;
   connecting a coaxial cable stub in series with said lines on the source side of said parallel combination of the coil and capacitor; and
   including a reactive impedance across said lines at the output side of said parallel combination of coil and capacitor and adjusting said capacitor until the power lines exhibit parallel resonance at said given frequency in series with said lines when viewed from the output end of said lines.

11. The invention defined in claim 11 which comprises the further step of utilizing unidirectional current from said source to develop a magnetic field in opposition to the electric field resulting from flow of that current from said source through said coil.

12. A radio frequency electrical filter comprising:
   a two-conductor, four-terminal, hollow type terminal block;
   a variable capacitor mounted at one end of said terminal block;
   a light emitting diode mounted on said block;
   a parallel circuit formed by a capacitor and a coil disposed within said block;
   a resistor, the coil being wound around said resistor; and
   means for connecting said parallel circuit between first and second ones of said four terminals and for connecting said resistor and light emitting diode in series with one another and their series combination in parallel with said variable capacitor across said second terminal and a third one of said terminals.

13. In a band rejection filter for use in the power leads to a radio, in combination:
   a pair of input terminals and a pair of output terminals;
   the parallel combination of a coil and a capacitor;
   a length of coaxial cable having its center conductor connected, at one end of said cable, to a respectively associated end of said coil;
   the outer conductor of said cable, at said one end of said cable, being connected to one input terminal and to one output terminal;
   the other input terminal being connected to the inner conductor of the cable at the other end of the cable;
   the other end of said coil being connected to the other output terminal; and
   a Zener diode connected between said outer conductor and said center conductor at the end of said coaxial cable adjacent to said parallel combination of a coil and a capacitor.

14. The invention defined in claim 13 in which the annode of said Zener diode is connected to said outer conductor.

* * * * *